US008080805B2

(12) United States Patent
Gordon et al.

(10) Patent No.: US 8,080,805 B2
(45) Date of Patent: Dec. 20, 2011

(54) FET RADIATION MONITOR

(75) Inventors: Michael Gordon, Yorktown Heights, NY (US); Steven Koester, Maple Grove, MN (US); Kenneth Rodbell, Sandy Hook, CT (US); Jeng-Bang Yau, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 4 days.

(21) Appl. No.: 12/719,962

(22) Filed: Mar. 9, 2010

(65) Prior Publication Data

US 2011/0220805 A1 Sep. 15, 2011

(51) Int. Cl.
*H01L 27/146* (2006.01)
(52) U.S. Cl. .................................. 250/370.09
(58) Field of Classification Search ........ 250/370.01–370.15; 378/98.8
See application file for complete search history.

(56) References Cited

U.S. PATENT DOCUMENTS

| | | | | |
|---|---|---|---|---|
| 5,103,277 A * | 4/1992 | Caviglia et al. | ............... | 257/348 |
| 5,164,805 A * | 11/1992 | Lee | ............... | 257/351 |
| 5,245,191 A * | 9/1993 | Barber et al. | ............ | 250/363.04 |
| 6,043,536 A * | 3/2000 | Numata et al. | ................. | 257/347 |
| 6,208,535 B1 * | 3/2001 | Parks | ............................. | 363/26 |
| 6,977,989 B2 * | 12/2005 | Bothe et al. | .................... | 378/108 |
| 2004/0094811 A1 * | 5/2004 | Takagi | .......................... | 257/411 |
| 2005/0040462 A1 * | 2/2005 | Koh | ............................ | 257/344 |
| 2005/0194633 A1 * | 9/2005 | Mori | .............................. | 257/324 |
| 2006/0231892 A1 * | 10/2006 | Furukawa et al. | ........... | 257/347 |
| 2007/0184611 A1 * | 8/2007 | Oh et al. | ...................... | 438/244 |
| 2007/0190740 A1 * | 8/2007 | Furukawa et al. | ........... | 438/423 |
| 2007/0275690 A1 * | 11/2007 | Hunter et al. | .............. | 455/404.2 |
| 2008/0164528 A1 * | 7/2008 | Cohen et al. | .................. | 257/365 |
| 2008/0290413 A1 * | 11/2008 | Mandelman et al. | ......... | 257/347 |
| 2010/0027867 A1 * | 2/2010 | Bernhardt et al. | ............ | 382/132 |
| 2010/0140488 A1 * | 6/2010 | Visconti et al. | .......... | 250/370.07 |

OTHER PUBLICATIONS

Annamalai et al., "Radiation response of silicon on diamond devices,", 1993, IEEE Transactions on Nuclear Science, vol. 40, No. 6, pp. 1780-1786.*
Schwank et al., "BUSFET—A radiation-hardened SOI transistor," 1999, IEEE Transaction on Nuclear Science, vol. 46, No. 6, pp. 1909-1816.*
Shaneyfelt, et al., An Embeddable SOI Radiation Sensor, IEEE Transactions on Nuclear Science, Dec. 2009, pp. 3372-3380, vol. 56, No. 6, IEEE.

* cited by examiner

*Primary Examiner* — David Porta
*Assistant Examiner* — Kiho Kim
(74) *Attorney, Agent, or Firm* — Cantor Colburn LLP; Louis J. Percello

(57) ABSTRACT

A semiconductor device includes a semiconductor substrate; a buried insulator layer disposed on the semiconductor substrate, the buried insulator layer configured to retain an amount of charge in a plurality of charge traps in response to a radiation exposure by the semiconductor device; a semiconductor layer disposed on the buried insulating layer; a second insulator layer disposed on the semiconductor layer; a gate conducting layer disposed on the second insulator layer; and one or more side contacts electrically connected to the semiconductor layer. A method for radiation monitoring, the method includes applying a backgate voltage to a radiation monitor, the radiation monitor comprising a field effect transistor (FET); exposing the radiation monitor to radiation; determining a change in a threshold voltage of the radiation monitor; and determining an amount of radiation exposure based on the change in threshold voltage.

35 Claims, 4 Drawing Sheets

400

```
APPLY BACKGATE VOLTAGE TO SILICON SUBSTRATE OF FET RADIATION MONITOR
401
```

```
FET RADIATION MONITOR IS EXPOSED TO RADIATION
402
```

```
THRESHOLD VOLTAGE OF FET RADIATION MONITOR CHANGES
BASED ON RADIATION EXPOSURE
403
```

```
APPLY READOUT VOLTAGE TO GATE OF FET RADIATION MONITOR TO DETERMINE CHANGE
IN THRESHOLD VOLTAGE
404
```

```
DETERMINE AMOUNT OF RADIATION EXPOSURE BASED ON CHANGE IN THRESHOLD
VOLTAGE
405
```

FIG. 4

FET RADIATION MONITOR

FIELD

This disclosure relates generally to the field of radiation monitoring and dosimetry.

DESCRIPTION OF RELATED ART

Radiation may come in various forms, including such as x-rays, y-rays, or β-rays. There are various types of radiation monitors that may be used to determine an amount of radiation exposure, such as ionization detectors, Geiger counters, and thermoluminescent detectors (TLDs). Geiger counters and ionization detectors may determine and display a dose rate (for example, in mRad/hr) or an integrated dose (for example, in Rads) of radiation exposure in real time. Alarm set points may be programmed based on the dose rate or the integrated dose. A Geiger counter or ionization detector may communicate with a computer for data logging or firmware updates. However, Geiger counters and ionization detectors may be relatively expensive. TLDs allow determination of a dose of radiation based on emission of photons in response to application of heat. TLDs may be relatively inexpensive, but may only be read after a period of exposure time, typically between one and three months. A degree of radiation exposure may only be determined after-the-fact using a TLD; real time dose information is not available.

A semiconductor radiation monitoring device may comprise a p-channel metal-oxide-semiconductor field effect transistor (MOSFET) transistor structure having a gate oxide layer fabricated on bulk silicon. Holes may be induced in the FET structure by ionizing radiation exposure and trapped in the gate oxide by a voltage applied to the gate, and the threshold voltage ($V_{th}$) of the transistor may change according to the amount of trapped holes. However, in order to measure the change in $V_{th}$, a negative voltage is applied to the gate, which may trigger the release of the holes trapped in the gate oxide via direct or trap-assisted tunneling. Therefore, electrical readout of the $V_{th}$ shift to determine the radiation dose in such a FET-type dosimeter may cause a loss of the radiation-induced charge, leading to incorrect long-term total dose data. Further, the trapping voltage and the readout voltage are both applied at the gate, they may not be applied at the same time, so real-time information regarding a dose of radiation may not be obtained.

SUMMARY

In one aspect, a semiconductor device includes a semiconductor substrate; a buried insulator layer disposed on the semiconductor substrate, the buried insulator layer configured to retain an amount of charge in a plurality of charge traps in response to a radiation exposure by the semiconductor device; a semiconductor layer disposed on the buried insulating layer; a second insulator layer disposed on the semiconductor layer; a gate conducting layer disposed on the second insulator layer; and one or more side contacts electrically connected to the semiconductor layer.

In one aspect, a method for radiation monitoring, the method includes applying a backgate voltage to a radiation monitor, the radiation monitor comprising a field effect transistor (FET); exposing the radiation monitor to radiation; determining a change in a threshold voltage of the radiation monitor; and determining an amount of radiation exposure based on the change in threshold voltage.

Additional features are realized through the techniques of the present exemplary embodiment. Other embodiments are described in detail herein and are considered a part of what is claimed. For a better understanding of the features of the exemplary embodiment, refer to the description and to the drawings.

BRIEF DESCRIPTION OF THE SEVERAL VIEWS OF THE DRAWINGS

Referring now to the drawings wherein like elements are numbered alike in the several FIGURES:

FIG. 4 illustrates a method for radiation monitoring using an FET radiation monitor.

DETAILED DESCRIPTION

Embodiments of systems and methods for a FET radiation monitor are provided, with exemplary embodiments being discussed below in detail. A FET radiation monitor may be fabricated using a fully depleted silicon-on-insulator (FD-SOI) MOSFET that is capable of detecting doses of various types of ionizing radiation, and that exhibits long-term charge retention that enables long-term tracking of total radiation dosage. The FET radiation monitor may be made as small or large as desired using semiconductor wafer fabrication technology, and may have a relatively low power drain.

A FET radiation monitor may be relatively small and inexpensive, and may be embedded in automobiles, buildings, air filters, or portable electronic devices such as computers, cell phones, music players, PDAs, or GPS, or in other items, including but not limited to passports, credit cards, or drivers licenses. The device may be in communication with a radiofrequency (RF) tag that may communicate a radiation dosage experienced by the FET radiation monitor to an RF tag reader. Integrated radiation dose information may be determined from the radiation monitor so that treatment decisions may be made quickly in an emergency situation. A radiation monitor may also be implanted into the body of a patient undergoing radiation therapy, in order to determine radiation dosage to a tumor, or an amount of radiation received during medical imaging. Real-time radiation dose information may be gathered from the implanted radiation monitor to confirm that a proper dose of radiation is delivered to a patient. The FET radiation monitor may be used in conjunction with a relatively small battery or precharged capacitor. The FET radiation monitor may also be electrically connected with one or more inductors, and be used in conjunction with an LC circuit such as is described in U.S. application Ser. No. 12/627,076 (Cabral et al.), filed Nov. 30, 2009, which is herein incorporated by reference in its entirety.

Figure 1:
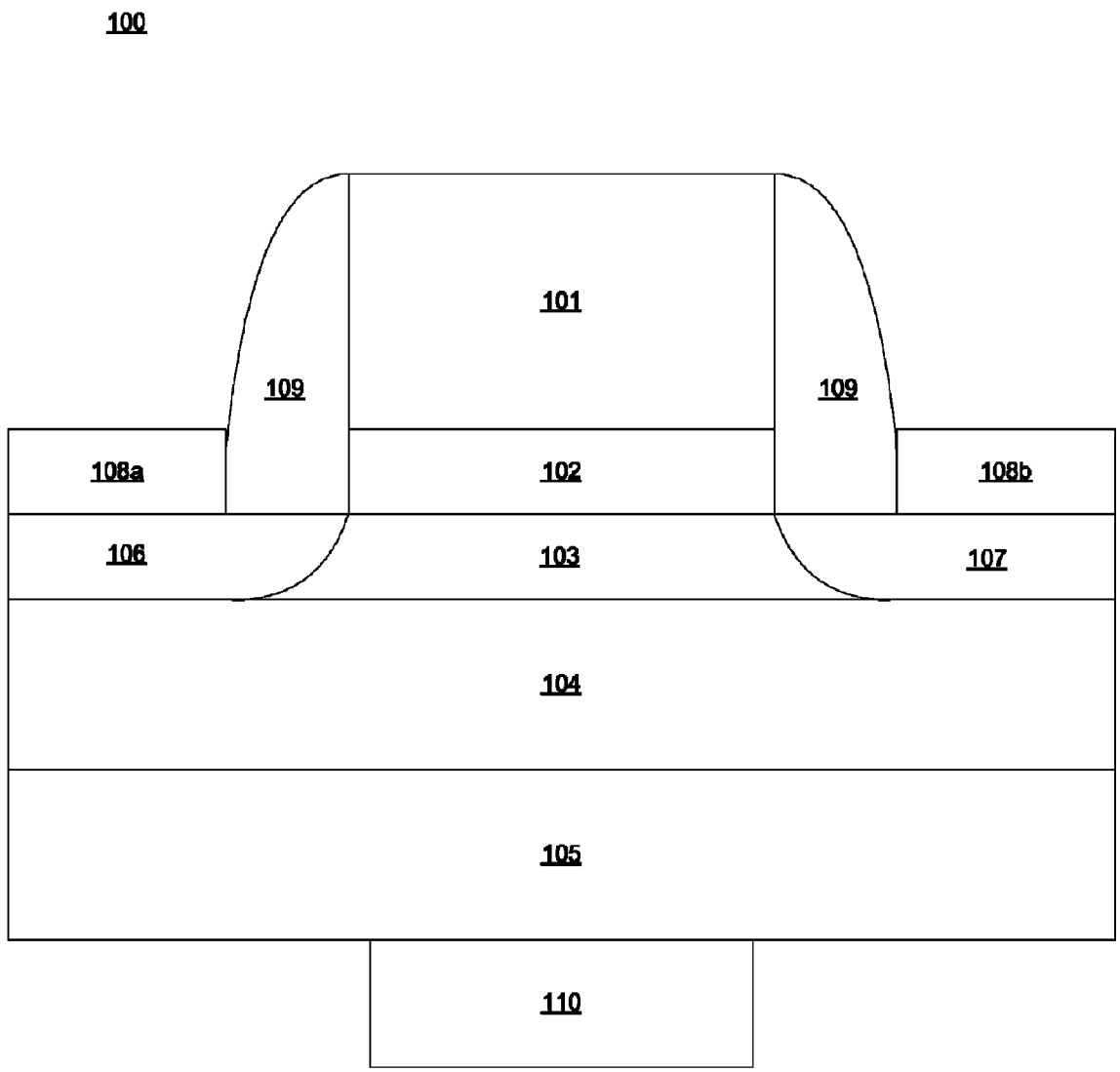
FIG. 1 illustrates a cross section of an embodiment of a FET radiation monitor.

FIG. 1 illustrates an embodiment of a cross section 100 of a radiation monitor. The radiation monitor comprises gate conductor layer 101, insulator layer 102, semiconductor layer 103, buried insulator layer 104, semiconductor substrate 105, source 106, drain 107, side contacts 108a-b, spacer material 109, and back contact 110. Gate conductor layer 101 may comprise one of polysilicon, a metal, or a silicide in some embodiments. Insulator layer 102 may comprise an oxide, such as silicon oxide or silicon oxide nitride, in some embodiments; the dielectric constant of the insulator layer 102 may be below about 4. Semiconductor layer 103 may comprise a silicon-on-insulator (SOI) layer in some embodiments, and may comprise undoped silicon, which may form fully-depleted SOI (FDSOI) under voltages used for normal operation of the FET radiation monitor. Buried insulator layer 104 may comprise buried silicon oxide (BOX), silicon oxide, or silicon nitride in some embodiments. Semiconductor substrate 105 may comprise one of silicon, germanium, silicon germanium, or gallium arsenide in some embodiments. Side contacts 108 may comprise implanted silicon, a metal, or a silicide in some embodiments. Spacer material 109 may comprise silicon nitride in some embodiments. Back contact 110 is electrically connected to semiconductor substrate 105, and side contacts 108a and 108b are electrically connected to source 106 and drain 107, respectively. The FET radiation monitor may comprise either an n-channel or a p-channel FET device.

Insulator layer 102 may be between about 5 angstroms and about 50 angstroms thick in some embodiments. Semiconductor layer 103 may be less than about 40 nanometers (nm) thick in some embodiments. A relatively thin semiconductor layer 103 may facilitate effective detection of the radiation dosage through monitoring the change of threshold voltage of the FDSOI FET comprising gate conductor layer 101, insulator layer 102, and semiconductor layer 103. The desired thickness of semiconductor layer 103 may be achieved by thermal oxidation of the surface of a SOI wafer. The oxidized silicon layer may then be removed, leaving the relatively thin layer of SOI. Standard semiconductor fabrication processes may be otherwise employed to fabricate the FET radiation monitor. Buried insulator layer 104 may be between about 500 and 2000 angstroms thick in some embodiments, and between about 1400 and 1600 angstroms thick in some exemplary embodiments. Semiconductor substrate 105 may be less than 800 microns thick in some embodiments.

Figure 2:
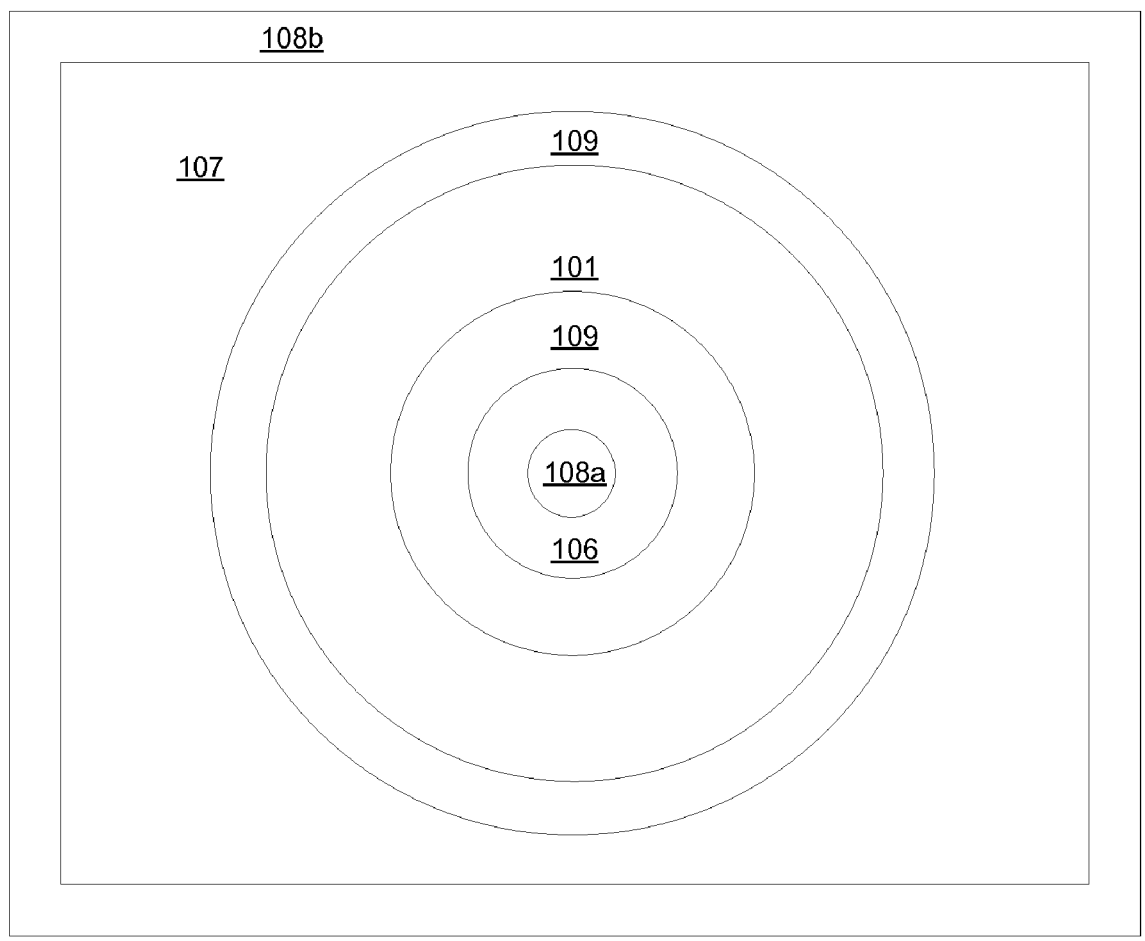
FIG. 2 illustrates a top view of an embodiment of a radiation monitor configured as a ring FET.

FIG. 2 illustrates an embodiment of a top view 200 of an embodiment of a radiation monitor configured as a ring FET. FIG. 2 is discussed with reference to FIG. 1. The radiation monitor comprises source 106, which is separated from gate conductor 101 by spacer material 109. Gate conductor 101 is separated from drain 107 by spacer material 109. Side contacts 108a and 108b are deposited on source and drain regions 106 and 107, respectively. The ring FET radiation monitor configuration of FIG. 2 is shown for illustrative purposes only; a radiation monitor may comprise any appropriate configuration of FET having a source, drain, and gate.

Figure 3:
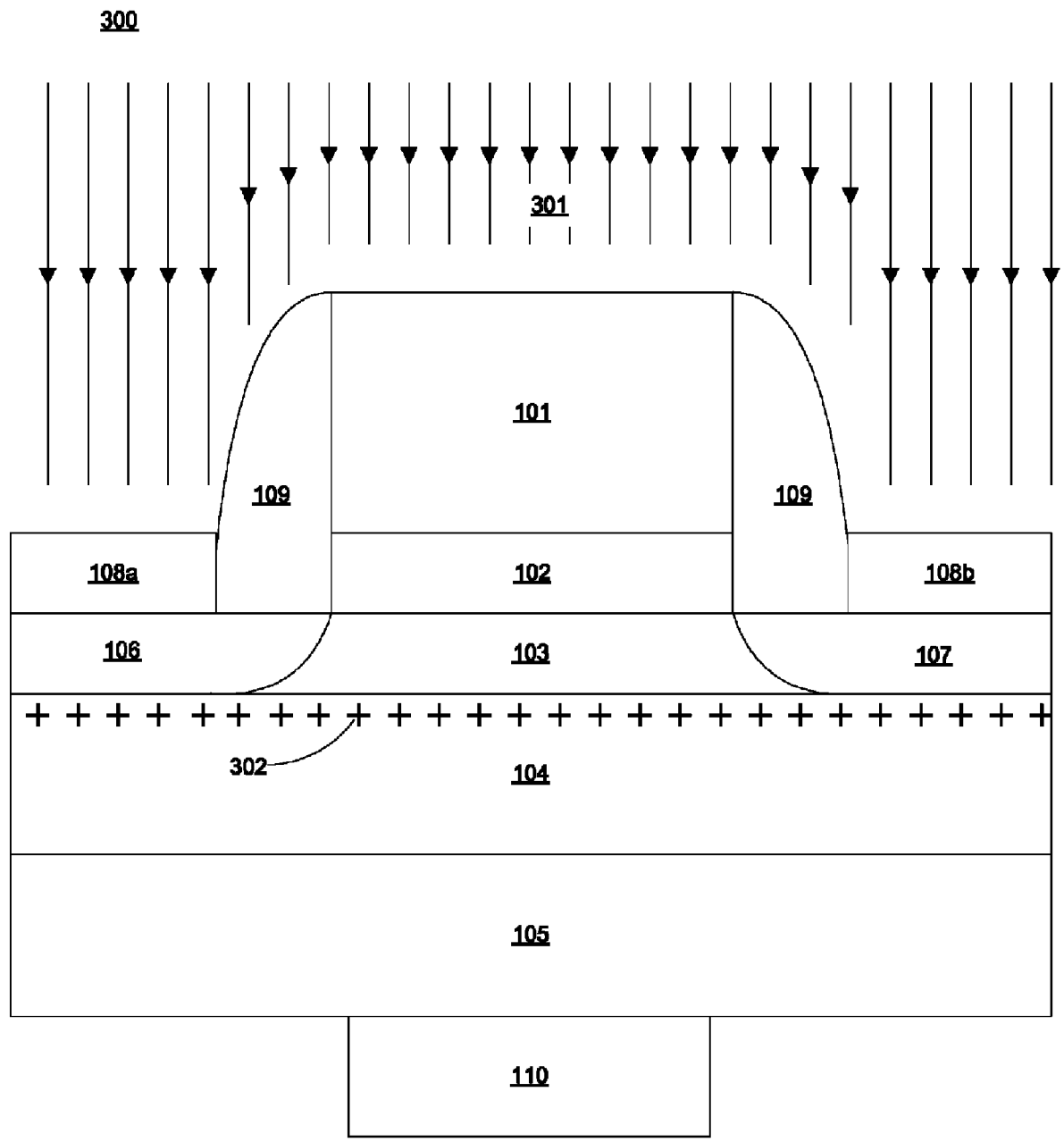
FIG. 3 illustrates a cross section of an embodiment of a FET radiation monitor.

FIG. 3 illustrates an embodiment of a cross section 300 of a FET radiation monitor after exposure to ionizing radiation 301. Radiation 301 may include but is not limited to high-energy ionizing radiation, proton beam, X-ray, photons, gamma ray, or neutron beam radiation. Radiation 301 causes electron-hole pairs to be created in semiconductor layer 102 and buried insulator layer 104, which causes a positive charge 302 to build up and be retained in buried insulator layer 104. The amount of positive charge 302 is indicative of the amount of radiation to which the radiation monitor has been exposed. Positive charge 302 leads to device degradation and a change in the FET radiation monitor's threshold voltage ($V_{th}$). The dose of radiation may be determined based on the change in $V_{th}$. Tracking the change in $V_{th}$ allows measurement of the total dose of radiation.

To prevent recombination of the electron-hole pairs created by radiation exposure 301, a backgate voltage ($V_{bg}$) is applied to semiconductor substrate 105 at back contact 110 to form a positive bias across the insulating layer 102 and buried insulator layer 104, so that electrons drift toward gate conductor 101 and semiconductor substrate 105 while holes move toward the interface between semiconductor layer 103 and buried insulator layer 104, forming positive charge 302. The buried insulator layer 104 may comprise a plurality of charge traps in which charge 302 is trapped; the number of charge traps per $cm^3$ of buried insulator material may be between about 1E17 and 1E18 in some embodiments. Positive charge 302 is thereby trapped in the buried insulator layer 104 by application of $V_{bg}$, and the trapped charge 302 causes the change in $V_{th}$. $V_{bg}$ is applied at the semiconductor substrate 105 during radiation exposure to keep the holes that are created by the radiation 301 trapped in buried insulator layer 104. This decouples the gate 101 of the FET radiation monitor from the trapped charge 302. Determination of $V_{th}$ may be performed by applying a readout voltage to gate conductor 101. The readout voltage may comprise a negative bias across buried insulator layer 104 and semiconductor layer 102. Application of the readout voltage at gate conductor 101 allows non-invasive real-time determination of $V_{th}$, as the readout voltage does not interfere with positive charge 302. The change in $V_{th}$ may also be measured by wiring the FET radiation monitor in a capacitor configuration, and measuring the change in capacitance between the gate conductor 101 and one of side contacts 108a or 108b at a zero gate voltage or at a constant gate voltage.

Because buried insulator layer 104 is electrically insulated from the ambient surroundings and from the electrodes (i.e., gate conductor 101, source 106, and drain 107) of the FET radiation monitor, the FET radiation monitor may exhibit good retention of charge 302 over time, with negligible degradation. For example, degradation of the radiation-induced $V_{th}$ shift may be less than about 10% over a period of about 25 days in a PFET radiation monitor, and over a period of about 15 days in an NFET radiation monitor. Charge retention allows use of the radiation monitor for tracking of long-term cumulative radiation treatments.

FIG. 4 illustrates an embodiment of a method 400 for radiation monitoring using a FET radiation monitor. FIG. 4 is discussed with reference to FIG. 3. In block 401, a backgate voltage ($V_{bg}$) comprising a positive bias is applied to a silicon substrate 105 of a FET radiation monitor. In block 402, the FET radiation monitor is exposed to radiation. $V_{bg}$ continues to be applied to the silicon substrate during the radiation exposure. In block 403, a threshold voltage ($V_{th}$) of the FET radiation monitor changes based on the amount of radiation to which the FET radiation monitor has been exposed, due to positive charge 302 built up in buried insulator layer 104. In block 404, a readout voltage is applied to a gate conductor 101 of the FET radiation monitor in order to determine the change in $V_{th}$. $V_{bg}$ may continue to be applied to the silicon substrate during readout in some embodiments. In block 405, the amount of radiation exposure is determined based on the change in $V_{th}$.

A single semiconductor substrate 105 may hold a plurality of FET radiation monitors, each FET radiation monitor comprising a separate gate conductor layer, insulator layer, semiconductor layer, buried insulator layer, source, drain, side contacts, spacer material, and back contact. A plurality of FET radiation monitors may also be arranged in an array, including but not limited a linear array, a 2-dimensional array, or a 3-dimensional array, in order to detect radiation doses in different areas and from different directions. The different directions may be orthogonal. In some embodiments, a filter may be disposed between a FET radiation monitor and the source of the radiation 301 to prevent some of radiation 301 from passing through the device, or to make the device more or less sensitive to the type of incident radiation. Another type of device may also be incorporated into the semiconductor substrate 105, including but not limited to a memory cell, a clock, a microprocessor, a DNA sensor, a biological sensor, a hazardous material sensor, a glucose sensor, a red blood cell sensor, or a camera.

The technical effects and benefits of exemplary embodiments include a relatively small, inexpensive radiation monitor that may be used to determine long-term or real-time radiation dosage information.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The invention claimed is:

1. A radiation monitor comprising:
   a semiconductor substrate;
   a buried insulator layer disposed on the semiconductor substrate, the buried insulator layer comprising a plurality of charge traps;
   a semiconductor layer disposed on the buried insulating layer;
   a second insulator layer disposed on the semiconductor layer;
   a gate conducting layer disposed on the second insulator layer;
   one or more side contacts electrically connected to the semiconductor layer; and
   a back contact electrically connected to the semiconductor substrate, the back contact configured to receive a backgate voltage during a radiation exposure by the radiation monitor, the backgate voltage comprising a positive bias across the buried insulator layer that is configured to trap an amount of positive charge in the charge traps in the buried insulator layer in response to the radiation exposure by the radiation monitor, wherein the amount of positive charge trapped in the charge traps in the buried insulator layer is used to determine the amount of the radiation exposure.

2. The radiation monitor of claim 1, wherein a number of charge traps per $cm^3$ of the buried insulator layer is between about 1E17 to 1E18.

3. The radiation monitor of claim 1, where a thickness of the semiconductor substrate is less than about 800 microns.

4. The radiation monitor of claim 1, where the semiconductor substrate comprises one of silicon (Si), germanium (Ge), silicon germanium (SiGe), or gallium arsenide (GaAs).

5. The radiation monitor of claim 1, where a thickness of the buried insulator layer is between about 500 and about 2000 angstroms.

6. The radiation monitor of claim 5, where a thickness of the buried insulator layer is between about 1400 and about 1600 angstroms.

7. The radiation monitor of claim 1, where the buried insulator layer comprises one of silicon oxide or silicon nitride.

8. The radiation monitor of claim 1, where a thickness of the second insulator layer is between about 5 and about 50 angstroms.

9. The radiation monitor of claim 1, where a dielectric constant of the second insulator layer is below about 4.

10. The radiation monitor of claim 1, where the second insulator layer comprises one of an oxide, silicon oxide, or silicon nitride.

11. The radiation monitor of claim 1, where the gate conductor layer comprises one of polysilicon, a metal, or a silicide.

12. The radiation monitor of claim 1, where the one or more side contacts comprise one of implanted silicon, a silicide, or a metal.

13. The radiation monitor of claim 1, further comprising a capacitance between the gate conductor layer and at least one of the one or more side contacts, wherein the capacitance varies as a function of the amount of positive charge trapped in the buried insulating layer.

14. The radiation monitor of claim 1, wherein the radiation comprises one or more of ionizing, proton beam, X-ray, photon, gamma ray, or neutron beam radiation.

15. The radiation monitor of claim 1, further comprising one or more inductors electrically connected to the gate conductor layer, wherein the one or more inductor and at least one of the one or more side contacts form a resonant circuit having a resonant frequency.

16. The radiation monitor of claim 15, wherein the resonant frequency changes as a function of the amount of charge trapped in the buried insulator layer.

17. The radiation monitor of claim 1, wherein the radiation monitor is placed inside a body to determine a dose of radiation experienced by the body.

18. The radiation monitor of claim 17, wherein the semiconductor device determines a dose of radiation received during medical imaging.

19. The radiation monitor of claim 17, wherein the semiconductor device determines a dose of radiation experienced by a tumor in the body.

20. The radiation monitor of claim 1, further comprising a plurality of semiconductor devices arranged in an array to determine a spatial distribution of radiation.

21. The radiation monitor of claim 20, where the array is one of a linear array, 2 dimensional array, or a 3 dimensional array.

22. The radiation monitor of claim 20, wherein a first plurality of semiconductor devices in the array is configured to detect radiation from a first radiation detection direction that is different from a second radiation detection direction of a second plurality of semiconductor devices in the array.

23. The radiation monitor of claim 22, wherein the first and second radiation detection directions are orthogonal.

24. The radiation monitor of claim 1, further comprising one or more filter layers disposed between the semiconductor device and a source of the radiation, the filter layers configured to prevent some of the radiation from passing through the semiconductor device, or to make the semiconductor device more or less sensitive to a type of incident radiation.

25. The radiation d monitor of claim 1, further comprising a second device disposed on the semiconductor substrate.

26. The radiation monitor of claim 1, wherein the semiconductor device is incorporated into one of a cell phone, a personal digital assistant (PDA), a computer, a piece of electronic equipment, an automobile, a building, an air filter, credit card, pass port, driver's license, a piece of paper, an envelope, food, a grocery store, or a security badge.

27. A method for radiation monitoring, the method comprising:
   applying a backgate voltage to a radiation monitor, the radiation monitor comprising a field effect transistor (FET) comprising a buried insulator layer, wherein the backgate voltage comprises a positive bias across the buried insulator layer;
   exposing the radiation monitor to radiation;
   trapping an amount of positive charge in a plurality of charge traps in the buried insulator layer by the backgate voltage in response to the radiation exposure;
   determining a change in a threshold voltage of the radiation monitor; and
   determining an amount of the radiation exposure based on the change in threshold voltage.

28. The method of claim 27, wherein determining the change in the threshold voltage comprises applying a readout voltage comprising a negative bias across the buried insulator layer to a gate conductor of the radiation monitor.

29. The method of claim 27, wherein the backgate voltage is applied to a back contact that is electrically connected to a semiconductor substrate of the radiation monitor.

30. The method of claim 27, wherein the radiation monitor comprises the buried insulator layer and a gate insulator layer separated by a semiconductor layer.

31. The method of claim 30, wherein the semiconductor layer is less than about 40 nanometers thick.

32. The method of claim 30, wherein the semiconductor layer comprises undoped silicon.

33. The method of claim 30, wherein the threshold voltage changes based on the amount of positive charge trapped in the buried insulator layer.

34. The method of claim 30, wherein the FET radiation monitor comprises an n-channel FET.

35. The method of claim 27, further comprising determining a change in a capacitance between a gate conductor and a side contact of the radiation monitor, and determining the change in the threshold voltage based on the change in capacitance.

* * * * *